(12) United States Patent
Taniguchi et al.

(10) Patent No.: US 7,867,559 B2
(45) Date of Patent: Jan. 11, 2011

(54) PHOTORESIST COATING LIQUID SUPPLYING APPARATUS, AND PHOTORESIST COATING LIQUID SUPPLYING METHOD AND PHOTORESIST COATING APPARATUS USING SUCH PHOTORESIST COATING LIQUID SUPPLYING APPARATUS

(75) Inventors: Katsuto Taniguchi, Kakegawa (JP); Kazuhiro Kojima, Kakegawa (JP); Atsuko Noya, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 903 days.

(21) Appl. No.: 11/664,342

(22) PCT Filed: Nov. 25, 2005

(86) PCT No.: PCT/JP2005/021699
§ 371 (c)(1),
(2), (4) Date: Mar. 29, 2007

(87) PCT Pub. No.: WO2006/057345
PCT Pub. Date: Jun. 1, 2006

(65) Prior Publication Data
US 2008/0087615 A1 Apr. 17, 2008

(30) Foreign Application Priority Data
Nov. 25, 2004 (JP) ............................. 2004-340811

(51) Int. Cl.
*B05D 3/12* (2006.01)
*B05C 13/02* (2006.01)
*B05C 11/10* (2006.01)

(52) U.S. Cl. .................. 427/240; 118/52; 118/603; 118/610; 438/782

(58) Field of Classification Search ................. 427/240; 118/52, 320, 603, 610; 438/782
See application file for complete search history.

(56) References Cited

U.S. PATENT DOCUMENTS 5,334,400 A 8/1994 Purdham (Continued)

FOREIGN PATENT DOCUMENTS

JP 1-278727 A 11/1989

(Continued)

OTHER PUBLICATIONS

English Language Abstract of JP 1-278727 A.

*Primary Examiner*—Kirsten C Jolley
(74) *Attorney, Agent, or Firm*—Alan P. Kass; Sangya Jain

(57) ABSTRACT

This invention provides a photoresist coating liquid supplying apparatus and a photoresist coating liquid supplying method, for supplying a photoresist coating liquid having a low particle content to a photoresist coating apparatus, and a photoresist coating apparatus using such a photoresist coating liquid supplying apparatus, which can realize coating without causing significant defects in a cost-effective manner.

The photoresist coating liquid supplying apparatus comprises a buffer vessel for a photoresist coating liquid, a circulation filtering apparatus for drawing a part of the coating liquid from the buffer vessel, filtering the coating liquid, and then returning the filtered coating liquid to the buffer vessel, and a pipe for supplying the coating liquid from the buffer vessel or the circulation apparatus to a coating apparatus. The photoresist coating liquid supplying method uses the photoresist coating liquid supplying apparatus. The photoresist coating apparatus comprises a combination of the coating liquid supplying apparatus with a slit coating apparatus.

17 Claims, 3 Drawing Sheets

U.S. PATENT DOCUMENTS 5,976,256 A * 11/1999 Kawano .................... 118/684
2001/0016427 A1    8/2001 Ueda

FOREIGN PATENT DOCUMENTS

| | | |
|---|---|---|
| JP | 6-247449 A | 9/1994 |
| JP | 6-267837 A | 9/1994 |
| JP | 8-24775 A | 1/1996 |
| JP | 2001-230191 A | 8/2001 |
| JP | 2002-66432 A | 3/2002 |
| JP | 2004-327747 A | 11/2004 |

* cited by examiner

PHOTORESIST COATING LIQUID SUPPLYING APPARATUS, AND PHOTORESIST COATING LIQUID SUPPLYING METHOD AND PHOTORESIST COATING APPARATUS USING SUCH PHOTORESIST COATING LIQUID SUPPLYING APPARATUS

This application is a United States National Stage Patent Application under 35 U.S.C. §371 of International Patent Application No. PCT/JP2005/021699, filed Nov. 25, 2005, which claims priority to Japanese Patent Application No. 2004-340811, filed Nov. 25, 2004, the contents of both documents being hereby incorporated herein by reference.

TECHNICAL FIELD

The present invention relates to an apparatus for supplying a photoresist coating liquid (hereinafter often referred to simply as "coating liquid") to a coating apparatus used for coating the photoresist coating liquid onto various substrates in a manufacturing process of electronic components using photolithography, for example, a manufacturing process of semiconductor elements such as LSIs and magnetic heads, various circuit boards, and flat panel displays (FPDs), and a coating liquid supplying method using the apparatus.

BACKGROUND ART

In a broad range of fields including, for example, semiconductor integrated circuits such as LSIs, the production of a display surface of FPDs, and the manufacture of circuit boards such as thermal heads, photolithography has hitherto been used for the formation of fine elements or microfabrication. In the photolithography, a photoresist coating liquid, which is a positive-working or negative-working photosensitive resin composition, is used for resist pattern formation.

FIG. 1 shows a conventional coating liquid supplying apparatus used in a conventional manufacturing process using photolithography. In the conventional coating liquid supplying apparatus, in supplying a coating liquid, the coating liquid is generally filled into a supplying vessel 101, for example, a glass vessel, a plastic vessel, a stainless steel vessel, or a drum. This vessel is connected to a pipe 102, and the coating liquid contained in the supplying vessel is supplied to a buffer vessel 104, for example, with a pump 103 or by blowing nitrogen gas or the like into the supplying vessel for pressurization. The coating liquid temporarily supplied to the buffer vessel 104 is if necessary filtered through a filter 105 to remove particles and the like contained in the coating liquid and is then coated through a coating liquid supplying nozzle 108 onto a substrate 106, for example, by a spin coating apparatus 107 shown in FIG. 1. Here a stainless steel vessel having an inner bag as described, for example, in patent document 1 may also be used as the supplying vessel 101. This vessel is as shown in FIG. 2 and has a double structure of an outer vessel 201 made of, for example, stainless steel and an inner bag 202 made of, for example, plastic. For example, nitrogen gas is blown through a gas introduction tube 203 into between the outer vessel 201 and the inner bag 202 to push out and supply a coating liquid contained in the inner bag into a coating apparatus.

On the other hand, the adoption of microfabrication of electronic components in recent years has led to a demand, in the field of the manufacture of electronic components such as semiconductor elements and liquid crystal display elements, that, in supplying and coating a coating liquid onto a substrate such as a silicon wafer, the coating liquid, from which fine particles and the like have been removed, could be efficiently and stably supplied.

Since, however, the coating liquid is supplied from various vessels to the apparatus buffer vessel, for example, the incorporation of foreign matter in pipes or other welded parts and a change in quality (the occurrence or increase of particles) of the coating liquid by physical stress can take place. In this case, when the condition of the coating liquid within the supplying vessel is compared with the condition of the coating liquid within the apparatus buffer vessel, there is a high tendency toward an increase in particles. Further, when a large-capacity supplying apparatus is used in order to lower the frequency of replacement of the supplying vessel, or when a large-capacity buffer vessel is used, for example, from the viewpoint of stabilizing the production process, the residence time of the coating liquid in each vessel is increased, often leading to increased particles with the elapse of time. The particles generated by such causes lead to a failure in the photolithographic process which is causative of a lowered yield of the product.

Accordingly, at the present time, it is common practice to filter the coating liquid through a filter before the supply of the coating liquid onto a substrate (see patent document 2). When the above quality change occurs with the elapse of time, however, single filtration is unsatisfactory for contemplated results and, thus, at the present time, an improvement in yield of electronic components is desired.

In the manufacture of semiconductor elements, in general, spin coating has hitherto been adopted for coating of the coating liquid. According to this method, in the spin coating, most of particles contained in the coating liquid, together with the coating liquid, is spun out to the outside of the substrate, and, thus, the problem of particles could have been considerably alleviated. In high-precision semiconductor elements demanded in recent years, very small quantity or fine particles, which have not hitherto caused any problem, sometimes become a problem. Accordingly, there is a demand for an improvement in quality over the conventional products. Further, wasteful use of the coating liquid by spin coating causes a problem of cost. Therefore, the development of a coating method alternative to the spin coating and an apparatus for supplying a coating liquid having quality high enough to be used in the coating method has been desired.

Patent document 1: Japanese Patent Laid-Open No. 247449/1994

Patent document 2: Japanese Patent Laid-Open No. 24775/1996 (pages 1 to 4)

DISCLOSURE OF THE INVENTION

Problems to be Solved by the Invention

Under the above circumstances, an object of the present invention is to provide an apparatus for supplying a coating liquid from a supplying vessel to a coating apparatus used for coating the coating liquid onto various substrates in a manufacturing process, using photolithography, of semiconductor devices, flat panel displays (FPDs), circuit boards, magnetic heads or other semiconductor elements, and a coating liquid supplying method using the apparatus.

Means for Solving the Problems

The present inventors have made extensive and intensive studies and, as a result, have found that the above object can be attained by interposing a circulation filtering apparatus for a photoresist coating liquid between a photoresist coating liquid supplying vessel and a buffer vessel in a coating apparatus to provide an apparatus, which can supply a photoresist coating liquid into a coating apparatus buffer vessel while always maintaining such a state that particles contained in the coating liquid have been reduced or removed, and a photoresist coating liquid supplying method using the apparatus, which has led to the completion of the present invention.

Thus, according to the present invention, there is provided a photoresist coating liquid supplying apparatus comprising: a buffer vessel for a photoresist coating liquid; a circulation filtering apparatus for drawing a part of the photoresist coating liquid from the buffer vessel, filtering the drawn photoresist coating liquid through a filter, and returning the filtered photoresist coating liquid to the buffer vessel; and a pipe for supplying the photoresist coating liquid from the buffer vessel or the circulation filtering apparatus into a photoresist coating apparatus.

Further, according to another aspect of the present invention, there is provided a method for supplying a photoresist coating liquid comprising: providing a photoresist coating liquid supplying apparatus comprising a buffer vessel for a photoresist coating liquid, a circulation filtering apparatus for filtering a part of the photoresist coating liquid within the buffer vessel through a filter and then returning the filtered photoresist coating liquid to the mother liquid of the photoresist coating liquid, and a pipe for supplying the photoresist coating liquid from the buffer vessel or the circulation filtering apparatus to a photoresist coating apparatus; and, while steadily circulation-filtering the photoresist coating liquid stored in the buffer vessel, supplying the photoresist coating liquid to the coating apparatus.

According to a further aspect of the present invention, there is provided a photoresist coating apparatus comprising: a slit coating apparatus; a buffer vessel for a photoresist coating liquid; a circulation filtering apparatus for drawing a part of the photoresist coating liquid from the buffer vessel, filtering the drawn photoresist coating liquid through a filter and then returning the filtered photoresist coating liquid to the buffer vessel; and a pipe for supplying the photoresist coating liquid from the buffer vessel or the circulation filtering apparatus to the slit coating apparatus.

Effect of the Invention

According to the present invention, a coating liquid in which particles have been reduced or removed can always be supplied to a coating apparatus. When a semiconductor element is manufactured using a coating liquid in which particles have been reduced or removed, the occurrence of defects in the semiconductor element can be reduced and the yield of the manufacture of electronic components such as semiconductor elements or liquid crystal display elements can be improved.

Further, according to the present invention, since a large quantity of coating liquid can be handled, the frequency of switching of the coating liquid supplying apparatus is lowered and, thus, the manufacturing efficiency can also be improved.

Furthermore, even when the coating liquid to be supplied contains a large amount of particles or even when a coating liquid containing particles generated during long-term storage in the supplying apparatus is used, the manufacture of semiconductor elements using a coating liquid having a reduced particle content can be realized by using the coating liquid supplying apparatus according to the present invention. Accordingly, the manufacture of semiconductor elements is less likely to be influenced by the quality of the coating liquid used, and, at the same time, products having stable quality can be supplied. Furthermore, the coating liquid supplied form the photoresist coating liquid supplying apparatus according to the present invention has a lower fine particle content than that in the case of the conventional supplying apparatus, and, further, the lower fine particle content can be maintained. Accordingly, the photoresist coating liquid supplying apparatus according to the present invention can also be utilized in the manufacture of higher-precision semiconductor elements. Therefore, the photoresist coating liquid supplying apparatus according to the present invention is also suitable for the supply of a coating liquid, for example, to a slit coating apparatus which could not have been utilized without difficulties due to high susceptibility to the contribution of fine particles.

DESCRIPTION OF REFERENCE CHARACTERS

101, 301A: photoresist coating liquid supplying vessel,
103, 304, 308: pump,
104, 401: buffer vessel,
105, 305, 309: filter,
106: substrate,
107: coating apparatus,
108: coating liquid supplying nozzle,
301: buffer vessel which functions also as photoresist coating liquid supplying vessel, and
601: valve.

BEST MODE FOR CARRYING OUT THE INVENTION

The present invention will be described in more detail with reference to the accompanying drawings.

Figure 3:
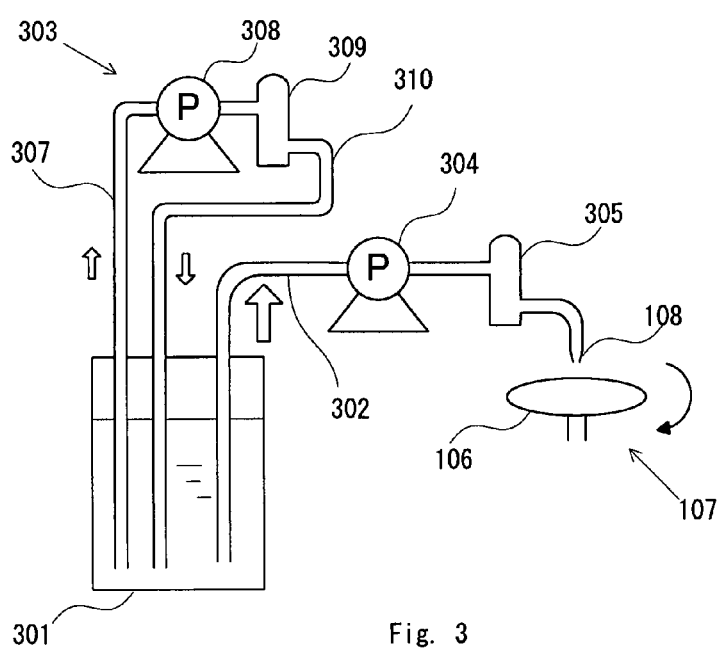
FIG. 3 is a conceptual diagram showing one embodiment of the photoresist coating liquid supplying apparatus according to the present invention.

One embodiment of the coating liquid supplying apparatus according to the present invention is shown in FIG. 3. This apparatus comprises a buffer vessel 301 for a coating liquid, a pipe 302 for supplying the coating liquid from the buffer vessel to a coating apparatus, and a circulation filtering apparatus 303 for drawing a part of the coating liquid from the buffer vessel, filtering the drawn coating liquid through a filter, and then returning the filtered coating liquid to the buffer vessel. The buffer vessel 301 functions also as a coating liquid supplying vessel. In this embodiment, a pump 304 is connected to the pipe 302, and the coating liquid is supplied through a filter 305 to a coating apparatus 107 by the pump 304. In this case, a method may also be adopted in which the buffer vessel is hermetically sealed, and an inert gas such as nitrogen gas is introduced into the buffer vessel to pressure-supply the coating liquid. In this case, the use of the pump 304 is unnecessary. Further, a plurality of coating apparatuses can be used in combination with one coating liquid supplying apparatus according to the present invention. For example, a plurality of pipes for the supply of a coating liquid extended from the pipe 302 to the coating liquid supplying nozzle 108 may be provided. Alternatively, a coating liquid can be supplied to a plurality of coating apparatuses by branching the pipe at the downstream of the pump 304 or on the downstream of the filter 305.

The circulation filtering apparatus 303 comprises a pipe 307 for drawing a part of a coating liquid from the buffer vessel 301, a pump 308 connected to the pipe 307, a filter 309 for filtering the coating liquid drawn by the pump 308, and a pipe 310 for returning the coating liquid filtered through the filter 309 to the buffer vessel 301. In the embodiment shown in FIG. 3, the circulation filtering apparatus 303 is disposed outside the buffer vessel 301. If the coating liquid within the buffer vessel can be filtered in the same manner, then the circulation filtering apparatus 303 may be placed in the buffer vessel, for example, may be immersed in the coating liquid. Also in the method, after the filtration of a part of the coating liquid within the buffer vessel, the filtered coating liquid can be returned to the mother liquid of the coating liquid, whereby the circulation filtration of the coating liquid is possible.

Particles are always removed from the coating liquid stored in the buffer vessel 301 by the circulation filtering apparatus 303 which is in steady operation. Thus, excellent quality can be maintained. Since this coating liquid is supplied to the coating apparatus 107, the manufactured semiconductor element also has no significant defect.

In the conventional photoresist coating apparatus, the circulation filtering apparatus as in the present invention was not provided. Accordingly, when particles are generated or increased in the coating liquid due to storage of the coating liquid in the buffer vessel for a long period of time, or when the coating liquid supplied per se contains particles, the proportion of the occurrence of defects in the manufactured semiconductor element is relatively high. In order to overcome this problem, it is common practice to filter the coating liquid through a filter 105 before coating of the coating liquid. In this method, however, the manufacturing process should be stopped for filter replacement which is causative of poor efficiency. According to the present invention, since the content of particles contained in the coating liquid in the buffer vessel is always controlled on a low level, the necessary frequency of replacement of the filter 305 is low. There is a tendency that, when the amount of particles in the buffer vessel is smaller, the increasing rate of particles is lower and, thus, the necessary frequency of replacement of the filter 305 is further lowered. Further, in the replacement of the filter 309, there is no need to stop the coating apparatus per se. Therefore, influence on the manufacturing efficiency is not significant. Furthermore, since the coating liquid supplied has a low particle content, the manufactured semiconductor element can also meet a need of higher precision.

In the embodiment shown in FIG. 3, the coating liquid supplying vessel as such is utilized as the buffer vessel 301. In the present invention, the supplying vessel refers to a vessel for supplying a coating liquid from the outside in the photoresist manufacturing process. That is, in the apparatus shown in FIG. 3, the supplying vessel functions also as the buffer vessel.

Figure 4:
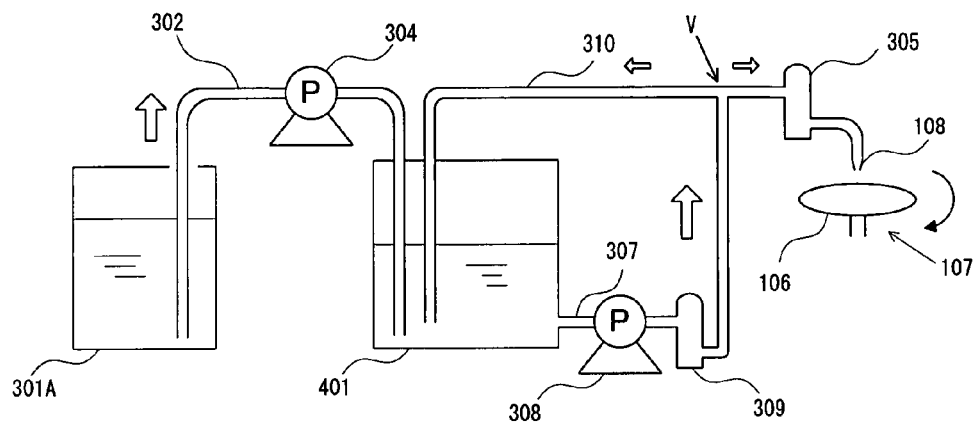
FIG. 4 is a conceptual diagram showing another embodiment of the photoresist coating liquid supplying apparatus according to the present invention.

Alternatively, a method may also be adopted in which a coating liquid is supplied from a separate supplying vessel to a buffer vessel and, while circulation-filtering the coating liquid, the coating liquid is supplied to a coating apparatus. This method is advantageous in that, since the buffer vessel does not become empty, the manufacturing process can be operated steadily and, further, inclusion of air bubbles in the pipe can also be prevented. An embodiment of this coating liquid supplying apparatus is shown in FIG. 4.

At the outset, a coating liquid is supplied from a supplying vessel 301A to a buffer vessel 401 through a pipe 302 and a pump 304 connected to the pipe 302. The coating liquid stored in the buffer vessel 401 is drawn through a pipe 307 by a pump 308, is filtered through a filter 309, and is then returned through a pipe 310 to the buffer vessel. Here a part of the coating liquid filtered through the filter 309 is divided on the downstream (position V) of the filter 309 into two parts, and one of the two parts is further filtered through a second filter 305, is then supplied to a coating apparatus 107, and is then coated onto a substrate 106. In this embodiment, the pipe of the circulation filtering apparatus is branched at the downstream of the filter. Accordingly, it can also be said that the pipe for supplying the coating liquid from the buffer vessel to the coating apparatus constitutes a part of the circulation filtering apparatus. In this coating liquid supplying apparatus, for example, a valve or a three-way valve may be provided at any desired position. For example, a valve or a three-way valve may be provided at position V to regulate the flow rate of the coating liquid to be supplied to the coating apparatus. This embodiment is advantageous in that, since the filer 309 in the circulation filtering apparatus is relatively close to the coating apparatus, the inclusion of foreign matter from within the pipe can be reduced. In order to remove the foreign matter included from within the pipe, a filter 305 may also be provided. The provision of this filter 305 may be omitted by disposing the filter 309 immediately before the coating apparatus.

The condition of the supplying apparatus may also be controlled while steadily measuring the particle content immediately before the coating apparatus or in the buffer vessel (not shown). The additional provision of this control means can realize the control of the filtration rate in the circulation filtering apparatus and the determination of the time of replacement of filters.

According to this apparatus, since the coating liquid does not become absent in the circulation filtering apparatus, there is no need to stop the coating liquid supplying apparatus in the replacement of the supplying vessel 301A. Accordingly, semiconductor elements can be manufactured continuously and stably, and, at the same time, advantageously, manufacturing defects derived, for example, from the inclusion of air bubbles in the pipe are also less likely to occur.

Further, in order to regulate the flow rate of the coating liquid supplied to the coating apparatus more simply and accurately, a second buffer vessel may also be provided on the upstream of the coating apparatus. An embodiment of this coating liquid supplying apparatus is shown in FIG. 5.

Figure 5:
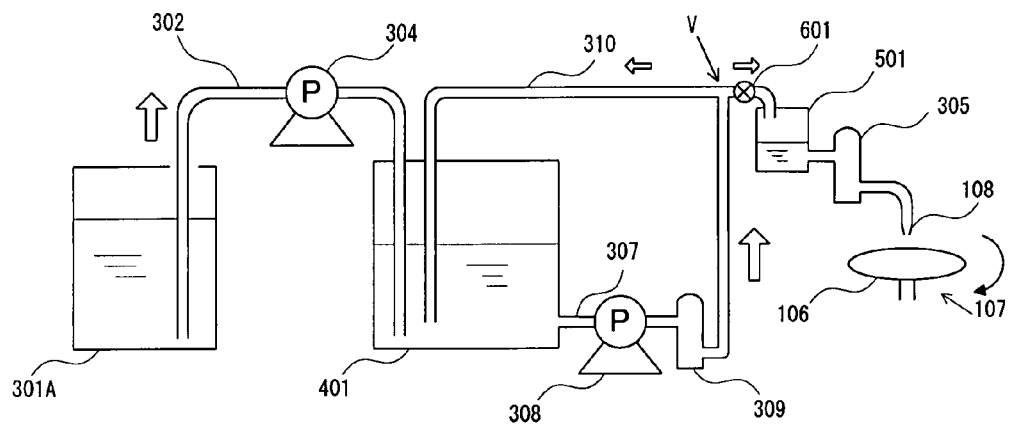
FIG. 5 is a conceptual diagram showing still another embodiment of the photoresist coating liquid supplying apparatus according to the present invention.

In the apparatus shown in FIG. 5, a part of the coating liquid filtered by the circulation filtering apparatus is stored in the second buffer vessel 501. The second buffer vessel 501 is provided for temporarily storing the coating liquid immediately before coating and thus generally has a smaller capacity than the buffer vessel 401. The coating liquid is supplied from the second buffer vessel 501 to the coating apparatus through the filter 305. In this case, a construction may also be adopted in which a valve 601 is provided on the downstream of the branch V at the coating apparatus side, and a liquid level sensor (not shown) is provided in the second buffer vessel 501. In this case, a system may be incorporated in which the valve 601 is controlled by a signal sent from the liquid level sensor to control the liquid level of the buffer vessel 501.

Figure 6:
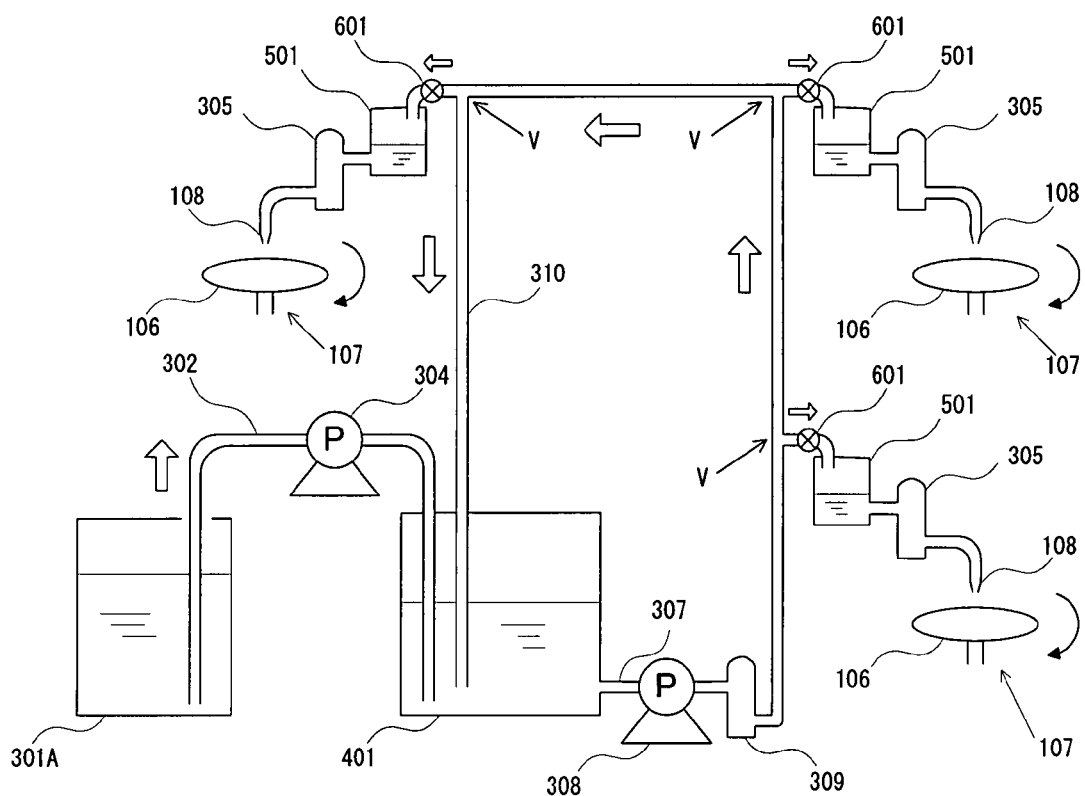
FIG. 6 is a conceptual diagram showing a further embodiment of the photoresist coating liquid supplying apparatus according to the present invention.

FIG. 6 shows an embodiment of the apparatus in which a plurality of branching points for supplying the coating liquid to the coating apparatus are provided. In this embodiment, a plurality of branches V for supplying the coating liquid to the coating apparatus are provided, and a coating liquid can be supplied to a plurality of coating apparatuses. Further, a system for controlling the liquid level of the buffer vessel 501 can be incorporated in each of the coating apparatuses to control and operate the coating apparatuses independently of each other. Further, a further filter or pump may also be provided between the braches V. According to the above construction, a large number of coating apparatuses can be operated by a small number of coating liquid supplying apparatuses, and, thus, equipment cost can be reduced. Further, since a coating liquid is used in a large number of coating apparatuses, the amount of the coating liquid used per unit time is increased. Accordingly, the residence time of the coating liquid in the supplying apparatus or buffer vessel is reduced, and, thus, a change in quality of the coating liquid in the coating liquid supplying apparatus can be suppressed. This can contribute to stable quality of manufactured semiconductor elements and the like. In the embodiment shown in FIG. 6, a second buffer vessel is provided. However, the second buffer vessel may not be provided.

Figure 1:
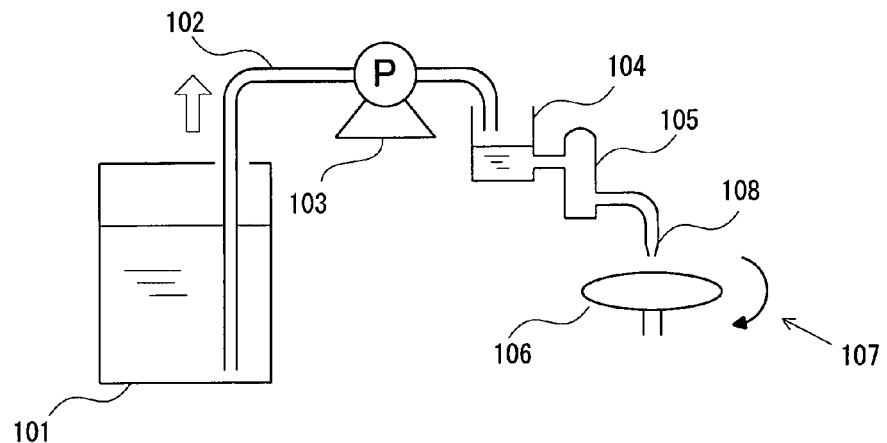
FIG. 1 is a conceptual diagram illustrating a conventional coating process of a semiconductor element.
Figure 2:
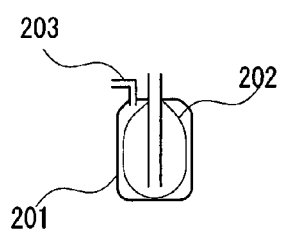
FIG. 2 is a cross-sectional view of one embodiment of a photoresist coating liquid supplying vessel.

In the apparatuses shown in FIGS. 4 to 6, a supplying vessel as shown in FIG. 2 may also be used instead of the supplying vessel 301A, the pipe 302, and the pump 304. In this case, the coating liquid stored in the inner bag is pressure-supplied by introducing gas into between the outer vessel and the inner bag in the vessel. Accordingly, in this case, there is no need to use any pump, and the contact with the outside air can be avoided. Therefore, the coating liquid within the vessel is less likely to be deteriorated. Further, also in the buffer vessels 401 and 501, when the inside of the vessel is not filled with the coating liquid and a space is present in the vessel, the properties of the coating liquid can be stabilized by introducing inert gas such as nitrogen gas into the space. A liquid level sensor may also be provided in the buffer vessels 401 and 501. This construction is advantageous in that, when the liquid level is low, a signal is sent from the sensor to control the pump or valve and to fill the coating liquid, or to stop the operation of the pump or the coating apparatus for preventing the operation under a liquid-free condition.

The vessels, pipes, pumps, filters and the like constituting the coating liquid supplying apparatus according to the present invention may be any of those commonly used in the prior art.

For example, glass vessels, plastic vessels, stainless vessels (provided with an inner bag), drums, or lorries commonly used in the prior art may be used as the coating liquid supplying vessel 301A. The material and the size of the vessel may be selected depending upon the necessary amount of the coating liquid supplied and the like.

The coating liquid is supplied from the coating liquid supplying vessel to the buffer vessel, for example, by any of a method in which the coating liquid is pressure-supplied by pressurizing the inside of the coating liquid supplying vessel with gas such as inert gas, a method in which the coating liquid is supplied by a pump, or a method in which the supplying vessel is laterally turned to allow the coating liquid to flow into the opening of the buffer vessel by taking advantage of the self-weight of the coating liquid. Gas or a pump may be used for the supply of the coating liquid from the buffer vessel to the coating apparatus. When a pump is used for the supply of the coating liquid, the use of, for example, a rotary pump is preferred. The pump of this type can suppress an increase in the amount of particles without applying unnecessary stress to the coating liquid.

Materials for the buffer vessel used in the present invention include, for example, polyethylene and stainless steel. If necessary, the inner side of the buffer vessel may be sheet-lined with or coated with a polymer such as Teflon (registered trademark). Further, if necessary, a temperature controller may also be provided in the vessel per se. The capacity of the buffer vessel may be properly set. In general, however, the capacity of the buffer vessel is 1 to 1000 liters. Depending upon the capacity of the buffer vessel, the flow rate of the coating liquid supplied to the coating apparatus and the flow rate of the coating liquid filtered by the circulation filtering apparatus are also varied. In general, the flow rate of the coating liquid supplied to the coating apparatus is 10 to 200 cc/min, and the flow rate of the coating liquid filtered by the circulation filtering apparatus is 500 to 3000 cc/min, preferably 1000 to 2000 cc/min.

The pipe in the coating liquid supplying apparatus according to the present invention is preferably made of stainless steel, and, if necessary, the inner side of the pipe may be lined with a polymer such as Teflon (registered trademark). Means for controlling the temperature of the coating liquid within the pipe may also be provided.

The filter used in the coating liquid supplying apparatus according to the present invention may be a filter commonly used in applications in electronic industries. Among them, filters in which the material for the filter film is Teflon (registered trademark), polyethylene or nylon are preferred. Further, preferably, the filter used in the present invention can satisfactorily remove particles having a size of not less than 0.5 µm, preferably not less than 0.2 µm.

Further, a liquid leakage sensor or a heat-sensitive sensor may be provided at any desired place in the coating liquid supplying apparatus according to the present invention. For example, upon unexpected occurrence of liquid leakage or temperature anomaly, these sensors can give prediction or alert to control the operation of the pump, valve or the like or can send an accident warning audible signal to a control panel.

Further, the valve or pump disposed in the coating liquid supplying apparatus according to the present invention can be directly controlled by a signal from a sensor provided in the photoresist coating apparatus connected thereto, for example, a liquid level sensor provided in the second buffer vessel 501, or can be controlled by a signal from a control unit for controlling the coating liquid supplying apparatus or the photoresist coating apparatus. In particular, the operating condition of each apparatus can be monitored by putting signals from each sensor together in a control unit provided with a control panel. In particular, a touch panel and the like may be used in the control panel. According to this control panel, information can easily be obtained, and, thus, the convenience is improved. Further, remote control can also be realized by incorporating a system such as PHS in the control panel.

The coating liquid supplied from the coating liquid supplying apparatus according to the present invention has a very low particle content, and, for example, the content of particles having a diameter of not more than 0.5 µm is always not more than 50 particles/ml. According to the present invention, the coating liquid having such low particle content can be supplied. When the coating liquid supplying apparatus according to the present invention is used in combination with a slit coating apparatus as the coating apparatus, excellent productivity can be realized. Specifically, the spin coating apparatus which has hitherto been commonly used in the art is advantageous in that, even when a particle-containing coating liquid is used, significant defects in coating do not occur because the particles can be removed together with the coating liquid which is spun out upon spinning. In the spin coating apparatus, however, only a small proportion of the coating liquid supplied to the coating apparatus is coated on the substrate, and, in general, not less than 90% by volume of the coating liquid is wasted. The coating liquid, which has been spun out during the coating, has a relatively high particle content and further suffer from a problem of inclusion of foreign matter. Accordingly, the spun-out coating liquid as such cannot be regenerated. For the above reason, in the spin coating, the loss of the coating liquid is so large that the spin coating is disadvantageously cost-ineffective. On the other hand, the level of loss of the coating liquid in the slit coating apparatus is generally zero except for dummy dispense and the like, but on the other hand, the slit coating apparatus is relatively likely to be influenced by particles contained in the coating liquid. The coating apparatus of the present invention comprises a combination of the above coating liquid supplying apparatus with a slit coating apparatus. In the coating apparatus according to the present invention, since a coating liquid having a low particle content is used, significant defects do not occur in the coating and, at the same time, the economic loss is also small. Accordingly, the coating apparatus according to the present invention can advantageously simultaneously realize product quality and cost.

The present invention is further illustrated by the following Examples that are not intended as a limitation of the invention.

Example 1

A change in the content of particles in a coating liquid was examined with an apparatus shown in FIG. 5. In this case, the following coating liquid supplying apparatus was used.
  Capacity of buffer vessel: 300 liters
  Flow rate of circulation filtering apparatus: 1000 cc/min
  Pump in circulation filtering apparatus: rotary pump manufactured by SAN MACHINERY
  Filter in circulation filtering apparatus: Microgard manufactured by Nihon Mykrolis K.K. (model UPE; exclusion particle diameter 0.1 µm)

AZ TFP-650F5 manufactured by AZ Electronic Materials was used as a coating liquid, and the content of particles (not less than 0.2 µm) supplied to a coating apparatus was measured with KL-20A Particle Counter manufactured by RION Co., Ltd. A change in particle content was as follows. The particle content was expressed in terms of relative value determined by presuming the number of particles immediately before the circulation to be 100.

TABLE 1

| | Particle Contetnt (relative value) |
|---|---|
| Before circulation | 100 |
| After 1 hr | 14 |
| After 5 hr | 4 |
| After 10 hr | 5 |
| After 24 hr | 3 |
| After 48 hr | 2 |
| After 72 hr | 3 |

When the coating liquid before the circulation is allowed to stay within the buffer vessel shown in FIG. 5 without circulation filtration, the particle content after 72 hr was 100 (relative value).

From the results, it is apparent that, according to the photoresist coating liquid supplying apparatus of the present invention, even when the coating liquid supplied contains particles, the particles can be removed and, further, the low particle content can be maintained for a long period of time. Further, when the coating liquid supplied from the supplying apparatus is coated onto a substrate, semiconductor elements, which cause no significant defects in the coating, can be provided.

The invention claimed is:

1. A method for supplying a photoresist coating liquid comprising: providing a photoresist coating liquid supplying apparatus comprising a buffer vessel for a photoresist coating liquid, a circulation filtering apparatus for filtering a part of the photoresist coating liquid within the buffer vessel through a filter and then returning the filtered photoresist coating liquid to the mother liquid of the photoresist coating liquid, and a pipe for supplying the photoresist coating liquid from the buffer vessel or the circulation filtering apparatus to a photoresist coating apparatus; and, while steadily circulation-filtering the photoresist coating liquid stored in the buffer vessel, supplying the photoresist coating liquid to the coating apparatus, further wherein the pipe for supplying the photoresist coating liquid from the buffer vessel into the photoresist coating apparatus is connected to a second buffer vessel provided on the upstream of the coating apparatus, which further comprises a valve provided on the upstream of the second buffer vessel, a liquid level sensor provided in the second buffer vessel, and a control system for controlling the valve by a signal sent from the liquid level sensor to regulate the volume of the photoresist coating liquid within the second buffer vessel.

2. A photoresist coating liquid supplying apparatus comprising: a buffer vessel for a photoresist coating liquid; a circulation filtering apparatus for drawing a part of the photoresist coating liquid from the buffer vessel, filtering the drawn photoresist coating liquid through a filter, and returning the filtered photoresist coating liquid to the buffer vessel; and a pipe for supplying the photoresist coating liquid from the buffer vessel or the circulation apparatus into a photoresist coating apparatus, further wherein the pipe for supplying the photoresist coating liquid from the buffer vessel into the photoresist coating apparatus is connected to a second buffer vessel provided on the upstream of the coating apparatus, which further comprises a valve provided on the upstream of the second buffer vessel, a liquid level sensor provided in the second buffer vessel, and a control system for controlling the valve by a signal sent from the liquid level sensor to regulate the volume of the photoresist coating liquid within the second buffer vessel.

3. The photoresist coating liquid supplying apparatus according to claim 2, wherein the pipe for supplying the photoresist coating liquid from the buffer vessel into the photoresist coating apparatus is branched at the downstream of the filter in the circulation filtering apparatus.

4. The photoresist coating liquid supplying apparatus according to claim 2, which comprises a plurality of pipes for supplying the photoresist coating liquid from the buffer vessel or the circulation apparatus into the photoresist coating apparatus.

5. The photoresist coating liquid supplying apparatus according to claim 4, wherein the pipe for supplying the photoresist coating liquid into the photoresist coating apparatus is branched at the downstream of the filter in the filtering device.

6. The photoresist coating apparatus of claim 2 where the photoresist coating apparatus is a slit coating apparatus.

7. The photoresist coating liquid supplying apparatus according to claim 3, wherein the pipe for supplying the photoresist coating liquid from the buffer vessel or the circulation apparatus into the photoresist coating apparatus is connected to a second buffer vessel provided on the upstream of the coating apparatus.

8. The photoresist coating liquid supplying apparatus according to claim 3, which comprises a plurality of pipes for supplying the photoresist coating liquid from the buffer vessel or the circulation apparatus into the photoresist coating apparatus.

9. The photoresist coating liquid supplying apparatus according to claim 2, which comprises a plurality of pipes for supplying the photoresist coating liquid from the buffer vessel into the photoresist coating apparatus is branched at the downstream of the filter in the circulation filtering apparatus.

10. The photoresist coating liquid supplying apparatus according to claim 2, where the second buffer vessel is smaller than the buffer vessel.

11. The photoresist coating liquid supplying apparatus according to claim 2, where the photoresist coating liquid supplied from the photoresist coating liquid supplying apparatus has a content of particles having a diameter of not more than 0.5 µm is not more than 50 particles/ml.

12. A photoresist coating liquid supplying apparatus comprising: a buffer vessel for a photoresist coating liquid; a circulation filtering apparatus for drawing a part of the photoresist coating liquid from the buffer vessel, filtering the drawn photoresist coating liquid through a filter, and returning the filtered photoresist coating liquid to the buffer vessel; and a pipe for supplying the photoresist coating liquid from the circulation apparatus into a photoresist coating apparatus, further wherein the pipe for supplying the photoresist coating liquid from the buffer vessel into the photoresist coating apparatus is connected to a second buffer vessel provided on the upstream of the coating apparatus, which further comprises a valve provided on the upstream of the second buffer vessel, a liquid level sensor provided in the second buffer vessel, and a control system for controlling the valve by a signal sent from the liquid level sensor to regulate the volume of the photoresist coating liquid within the second buffer vessel.

13. The photoresist coating liquid supplying apparatus according to claim 12, wherein the pipe for supplying the photoresist coating liquid from the circulation apparatus into the photoresist coating apparatus is branched at the downstream of the fitter in the circulation filtering apparatus.

14. The photoresist coating liquid supplying apparatus according to claim 12, which comprises a plurality of pipes for supplying the photoresist coating liquid from the circulation apparatus into the photoresist coating apparatus.

15. The photoresist coating liquid supplying apparatus according to claim 14, wherein the pipe for supplying the photoresist coating liquid into the photoresist coating apparatus is branched at the downstream of the filter in the filtering device.

16. The photoresist coating liquid supplying apparatus according to claim 12, where the second buffer vessel is smaller than the buffer vessel.

17. The photoresist coating liquid supplying apparatus according to claim 12, where the photoresist coating liquid supplied from the photoresist coating liquid supplying apparatus has a content of particles having a diameter of not more than 0.5 µm is not more than 50 particles/ml.

* * * * *